(12) United States Patent
Higashi et al.

(10) Patent No.: US 9,212,422 B2
(45) Date of Patent: Dec. 15, 2015

(54) CVD REACTOR WITH GAS FLOW VIRTUAL WALLS

(75) Inventors: Gregg Higashi, San Jose, CA (US);
Alexander Lerner, San Jose, CA (US);
Khurshed Sorabji, San Jose, CA (US);
Lori D. Washington, Union City, CA (US)

(73) Assignee: Alta Devices, Inc., Sunnyvale, CA (US)

( * ) Notice: Subject to any disclaimer, the term of this patent is extended or adjusted under 35 U.S.C. 154(b) by 1014 days.

(21) Appl. No.: 13/222,840

(22) Filed: Aug. 31, 2011

(65) Prior Publication Data
US 2013/0052346 A1  Feb. 28, 2013

(51) Int. Cl.
*C23C 16/455* (2006.01)

(52) U.S. Cl.
CPC ..... *C23C 16/45565* (2013.01); *C23C 16/45519* (2013.01)

(58) Field of Classification Search
CPC ............ C23C 16/455; C23C 16/45519; C23C 16/4552; C23C 16/45521; C23C 16/45525; C23C 16/45536; C23C 16/45553; C23C 16/45563; C23C 16/4557; C23C 16/45572; C23C 16/45573; C23C 16/45576; C23C 16/52; C23C 16/45565
See application file for complete search history.

(56) References Cited

U.S. PATENT DOCUMENTS

| | | | |
|---|---|---|---|
| 4,993,358 A | 2/1991 | Mahawili | |
| 5,059,770 A | 10/1991 | Mahawili | |
| 5,122,391 A | 6/1992 | Mayer | |
| 5,304,398 A | 4/1994 | Krusell et al. | |
| 5,647,945 A * | 7/1997 | Matsuse et al. | 156/345.38 |
| 5,792,272 A | 8/1998 | Van Os et al. | |
| 6,001,267 A | 12/1999 | Os et al. | |
| 6,113,700 A | 9/2000 | Choi | |
| 6,143,080 A | 11/2000 | Bartholomew et al. | |
| 6,294,026 B1 * | 9/2001 | Roithner et al. | 118/715 |
| 6,368,567 B2 * | 4/2002 | Comita et al. | 423/240 R |
| 6,821,563 B2 * | 11/2004 | Yudovsky | 427/248.1 |
| 7,153,542 B2 * | 12/2006 | Nguyen et al. | 427/248.1 |
| 7,789,961 B2 | 9/2010 | Nelson et al. | |
| 8,008,174 B2 | 8/2011 | He et al. | |
| 2004/0166597 A1 * | 8/2004 | Strang | 438/5 |
| 2006/0219362 A1 * | 10/2006 | Han et al. | 156/345.33 |
| 2007/0092732 A1 | 4/2007 | Rose et al. | |
| 2007/0215036 A1 * | 9/2007 | Park et al. | 117/88 |

(Continued)

OTHER PUBLICATIONS

Book: D.M. Dobkin et al., Principles of Chemical Vapor Deposition, 2003 Kluwer Academic Publishers, Chapter 3, 3 pages.

*Primary Examiner* — Jeffrie R Lund
(74) *Attorney, Agent, or Firm* — Thomas Schneck; Gina McCarthy

(57) ABSTRACT

A chemical vapor deposition reactor has one or more deposition zones bounded by gas flow virtual walls, within a housing having closed walls. Each deposition zone supports chemical vapor deposition onto a substrate. Virtual walls formed of gas flows laterally surround the deposition zone, including a first gas flow of reactant gas from within the deposition zone and a second gas flow of non-reactant gas from a region laterally external to the deposition zone. The first and second gas flows are mutually pressure balanced to form the virtual walls. The virtual walls are formed by merging of gas flows at the boundary of each deposition zone. The housing has an exhaust valve to prevent pressure differences or pressure build up that would destabilize the virtual walls. Cross-contamination is reduced, between the deposition zones and the closed walls of the housing or an interior region of the housing outside the gas flow virtual walls.

8 Claims, 7 Drawing Sheets

(56) References Cited

U.S. PATENT DOCUMENTS

| | | |
|---|---|---|
| 2008/0196666 A1 | 8/2008 | Toshima |
| 2009/0236447 A1 | 9/2009 | Panagopoulos et al. |
| 2009/0324379 A1 | 12/2009 | He et al. |
| 2009/0325367 A1 | 12/2009 | He et al. |
| 2010/0092668 A1* | 4/2010 | Hegedus .................. 427/255.28 |
| 2010/0147370 A1 | 6/2010 | He et al. |
| 2010/0206229 A1 | 8/2010 | He et al. |
| 2010/0206235 A1 | 8/2010 | He et al. |
| 2010/0209082 A1 | 8/2010 | He et al. |
| 2010/0209620 A1 | 8/2010 | He et al. |
| 2010/0209626 A1 | 8/2010 | He et al. |
| 2010/0212591 A1 | 8/2010 | He et al. |
| 2010/0219509 A1 | 9/2010 | He et al. |
| 2010/0229793 A1 | 9/2010 | He et al. |
| 2010/0233879 A1 | 9/2010 | Ryan |
| 2011/0214812 A1 | 9/2011 | Song et al. |
| 2011/0268880 A1 | 11/2011 | Bour |
| 2012/0234230 A1* | 9/2012 | Halpin et al. .................. 117/97 |
| 2012/0321786 A1* | 12/2012 | Satitpunwaycha et al. ... 427/252 |
| 2013/0052346 A1* | 2/2013 | Higashi et al. ............. 427/248.1 |

\* cited by examiner

CVD REACTOR WITH GAS FLOW VIRTUAL WALLS

TECHNICAL FIELD

The field of the present invention relates to chemical vapor deposition (CVD) reactors.

BACKGROUND

An ongoing concern with known chemical vapor deposition reactors is contamination of a workpiece in a reactor from processing gases, reaction byproducts or particulates. Sources of contaminants include processing gases and reaction byproducts from previous or adjacent reactions, and particulates deposited on reactor surfaces. A known, standard CVD reactor has a single reaction chamber. A substrate being processed in such a CVD reactor is surrounded by the physical walls of the chamber. Particulates deposited on the walls of the chamber can detach from the walls and contaminate a substrate being processed in the chamber. Some particulates arise from chemical reactions of reactant gases that are not in the desired locations on the substrate. These are internal contaminants. Other particulates are from external sources not associated with reactant gases. These are external contaminants. Multichamber CVD reactors can have cross-contamination of reactant gases, reaction byproducts and particulates from one chamber to or from another chamber, and from any of the chambers to or from the physical walls of the CVD reactor or from external sources. All contaminants are problematic. A know nitrogen purge curtain between adjacent reaction chambers alleviates some of the contamination in a multichamber CVD reactor.

U.S. Pat. No. 5,122,391 discloses an atmosphere pressure chemical vapor deposition system that has a conveyor belt and drive system for continuous processing through one or more reaction chambers separated by nitrogen purge curtains. The system has an enclosure surrounding the reaction chambers and a conveyor belt running past the chambers. Nitrogen purge curtains are placed between adjacent chambers. The process runs continuously, with the conveyor belt moving continuously at about 380 millimeters per minute. In the main reaction chamber, an injector establishes a laminar gas flow over the surface of the substrate in the atmospheric pressure chemical vapor deposition (APCVD) process.

It is a goal of the present invention to further decrease exposure to contamination in a CVD reactor, for a substrate undergoing processing in the reactor.

SUMMARY

The above objective has been achieved in a CVD reactor that features one or more chemical vapor film deposition zones partly established by virtual walls formed by gas flows protecting a chemical vapor deposition zone. Each deposition zone is within a single containment housing having physical walls and providing infrastructure for the chemical vapor deposition zones and the gas flow virtual walls.

In one embodiment, a CVD reactor for film formation has a housing. The housing has closed walls and one or more spaced apart film deposition zones therein. Each film deposition zone supports chemical vapor deposition from a respective showerhead within the housing, onto a heated substrate below the showerhead. Gas flow virtual walls laterally surround the film deposition zone. The gas flow virtual walls are formed by merger of a first gas flow and a second gas flow. The first gas flow is of a reactant gas in a carrier gas, and comes from gas inlets of a showerhead. The second gas flow is of a non-reactant gas from a region laterally external to the deposition zone. The first and second gas flows are mutually pressure balanced to form the virtual walls by merging of gas flows. The pressure balancing, the virtual walls and the merging of gas flows reduce cross-contamination between the film deposition zone and the closed walls of the housing or an interior region of the housing outside the gas flow virtual walls.

Restating the arrangement, a CVD reactor for film formation has a containment housing with a plurality of chemical vapor deposition zones inside of one containment housing. Each chemical vapor deposition zone has a perimeter exhaust port. The chemical vapor deposition zone is circumferentially bounded by virtual walls. The virtual walls are defined by a first gas flow that is a radially outward gas flow of a reactant gas from a showerhead. A second gas flow is a radially inward gas flow of a non-reactant gas that merges with the first gas flow proximate to the exhaust port to form a virtual wall with merged flow exiting out through a perimeter exhaust port.

A chemical vapor deposition method features providing a containment housing where one or more chemical vapor deposition zones is established. Each deposition zone is circumferentially bounded by a perimeter exhaust port. Further, the deposition zone is circumferentially bounded by virtual walls by providing a first radially outward gas flow and a second radially inward gas flow that merge and exit out through the perimeter exhaust port. The first and second gas flows are controlled so as to minimize overshoot of the exhaust port by the first gas flow or by the second gas flow. Controlling the first and second gas flows maintains the virtual walls bounding the chemical vapor deposition zone. Pressure differences between deposition zones are minimized by minimizing overall pressure difference within the housing thereby stabilizing the virtual walls.

DETAILED DESCRIPTION

Figure 1:
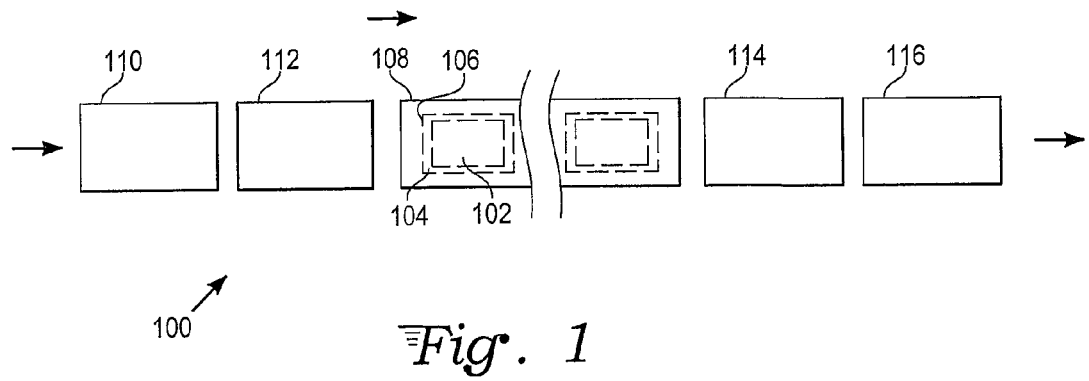
FIG. 1 is a plan view showing a CVD reactor in accordance with the present invention wherein multiple chemical vapor deposition zones are each surrounded by gas flow virtual walls.

With reference to FIG. 1, a CVD reactor 100 in accordance with the invention provides improvements in contamination reduction for wafers or other substrates being processed by deposition of thin films using CVD. The CVD reactor 100 has a containment housing (not shown in FIG. 1, and see FIG. 2) and a process chamber 108 having one or more processing sections and including one or more instances of a chemical vapor deposition zone 104. The containment housing has physical walls made of metal or other materials, and seals the process chamber 108 from the outside environment. The chemical vapor deposition zone 104 is circumferentially bounded by or laterally surrounded by gas flow virtual walls 106. A target reaction zone 102 within the chemical vapor deposition 104 is where a substrate receives chemical vapor deposition. One or a plurality of wafers or other substrates to be processed is initially placed in a glovebox 110 at the entrance of the CVD reactor 100. The substrate or plurality of substrates proceeds from the entrance glove box 110 to an entrance load lock 112, from the entrance load lock 112 to the process chamber 108, from the process chamber 108 to an exit load lock 114, and from the exit load lock 114 to an exit glovebox 116. In the process chamber 108, various processes are performed on the substrate or substrates in each of the one or more processing sections in succession. One or more of the processing sections may include a chemical vapor deposition zone 104 surrounded by respective gas flow virtual walls 106. In one example, the containment housing surrounds and seals the process chamber using physical walls, the load locks are mated to the process chamber, and the glove boxes are mated to the load locks. In a further example, the containment housing surrounds and environmentally seals the glove boxes, load locks and the process chamber as an integrated unit, using physical walls. In still further examples, various sections are modular and a CVD reactor can be expanded or contracted by adding or removing one or more sections, reconfigured or have one or more sections swapped out in upgrades or for different processes and so on. Further variations are readily devised.

As used herein, the term "physical walls" means one or more walls constructed of one or more solid materials as distinguished from the gas flow virtual walls 106. As used herein, the term "virtual walls" is a collective term meaning one or more non-solid barriers as formed by the described gas flows. The virtual walls may be of various geometries. Examples of geometries for the virtual walls include a four sided wall or four walls forming a square or rectangular perimeter, a circular wall or walls forming a circle, an oval wall or walls, and a wall or walls forming other geometric shapes. Virtual walls bounding or laterally surrounding a region form a closed geometric shape, i.e. a closed polygon or other two-dimensional shape. The virtual walls have a three-dimensional nature, in that the barrier presented by the virtual walls has a height, a thickness and a perimeter length, extent or circumference.

The new CVD reactor 100 supports an assembly line or pipeline process. Substrates proceed from one end of the reactor to the other end of the reactor, passing through one or more deposition zones en route. The reactor may have further processing zones preceding, following, including or interspersed with the deposition zones.

The target reaction zone 102 is the surface of a substrate, usually a wafer, that is supported on a heated carrier as the floor of the deposition zone in one example. A single or tiled showerhead supplying CVD reactive gases forms a ceiling over the substrate. In further examples, other means for supplying CVD reactive gases and performing chemical vapor deposition may be used. Gas flow paths circumferentially surround the substrate and the deposition zone forming virtual walls, partly supplied by radially outward gas flow from the showerhead. A floor, ceiling, and lateral walls are now established for the deposition zone. The lateral walls are provided by the gas flow virtual walls, which have a three-dimensional nature as will be further described.

The deposition zone 104 is housed within a CVD showerhead reactor 100 where the showerhead is integrated into a ceiling of the containment housing, in one example. In a further example, the showerhead is supported within the containment housing. In a CVD reactor having a single deposition zone, no CVD reactions are intended outside of the deposition zone, but the gas, supply, thermal, electrical and mechanical infrastructure of the CVD reactor are used to support CVD reactions of the deposition zone. This arrangement provides a ppb (parts per billion, e.g. of contaminants) environment in the deposition zone within the gas flow virtual walls, while a ppm (parts per million, e.g. of contaminants) environment exists outside of the gas flow virtual walls in the remainder of the containment housing. In a CVD reactor having multiple deposition zones, each deposition zone is protected by respective gas flow virtual walls, which greatly decreases cross-contamination. A single showerhead, a tiled showerhead, multiple single showerheads, or multiple tiled showerheads are used in variations of the CVD reactor 100.

Figure 2:
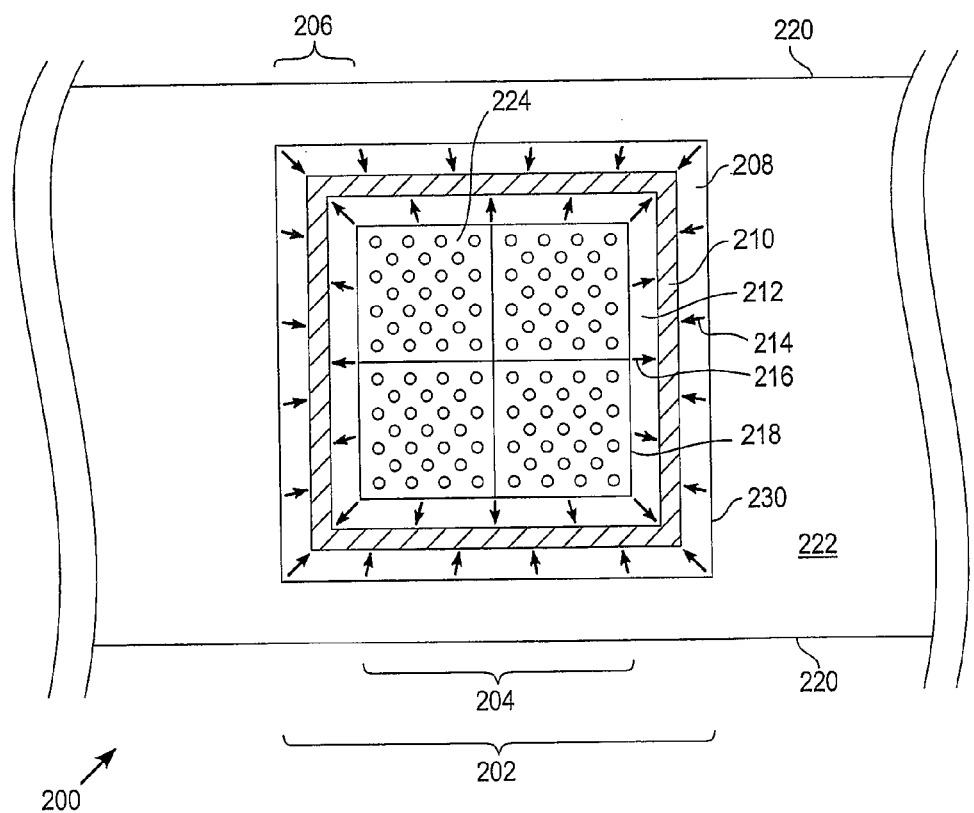
FIG. 2 is a bottom view of a tiled showerhead as used in the CVD reactor of FIG. 1, with gas flows defining virtual walls for the chemical vapor deposition zone.

With reference to FIG. 2, the gas flow virtual walled deposition zone 200 has virtual walls 206 surrounding the target reaction zone 204. The virtual walls 206 are defined by gas flows 214, 216. A showerhead assembly 202 is seen from below as if viewed by a substrate in the deposition zone. The virtual walls 206 laterally or circumferentially surround the deposition zone and the target reaction zone 204 and thus define the outer perimeter of the deposition zone, while an opposed substrate reaction zone and spaced-apart showerhead form a respective floor and ceiling of the deposition zone. Thus, the target reaction zone 204, which includes the surface of the substrate, is within the deposition zone, and the deposition zone is laterally bounded by the virtual walls 206.

A tiled showerhead 218 is centered in the deposition zone, spaced above the target reaction zone 204 and generally parallel to it. In further variations, a single showerhead or groups of tiled showerheads are used. The example in FIG. 2 uses a tiled showerhead 218 with a two by two array of square showerhead tiles 224. In variations, other shapes of showerhead tiles are used. An exhaust port 210 laterally surrounds the showerhead tiles 224. A gas, gas mixture or plurality of gases is introduced by the showerhead tiles 224, and flows laterally outward as a first gas flow 216 to the exhaust port 210. A further gas, gas mixture or plurality of gases is introduced in the outer chamber, e.g., by nozzles or apertures and flows laterally inward as a second gas flow 214 to the exhaust port 210. The exhaust port 210 pulls out gases from the showerhead tiles in the deposition zone interior to the virtual walls 206 and pulls out gases originating from outside of the virtual walls 206, using low pressure supplied by a vacuum pump (not shown) to establish the virtual walls 206 formed by gas flow. In various examples, the first and second gas flows 216, 214 are established using apertures, nozzles, channels or other gas inlets of the showerhead assembly. In the example shown, the showerhead tiles 224 are depicted as having apertures for emitting a process gas or gases, with or without a carrier gas. Various configurations of apertures or other gas inlets are readily devised for variations. In one variation, a further gas or gases is emitted by apertures in inner ring region 212 of the showerhead assembly 202 between the showerhead tiles 224 and the exhaust port 210, and the gases from the showerhead tiles 224 or reaction byproducts thereof join with the gases emitted from the inner ring region 212 to form the first gas flow 216. A gas or gases emitted from an outer ring region 208 of the showerhead assembly forms the second gas flow 214. The inner ring region 212 and the outer ring region 208 are laterally interior to and laterally exterior to the exhaust port 210, respectively. In the example shown, the showerhead assembly 202 includes an integrator plate 230, to which the tiled showerhead 218 and exhaust port 210 are mounted. The integrator plate includes apertures, nozzles, channels or other gas distribution fittings for providing the described gas flows. Variations for mounting the tiled showerhead or other showerheads and the exhaust port or other ports are readily devised, using the teachings disclosed herein.

In one example, the first gas flow 216 includes one or more reactive gases. In a further example, the first gas flow includes one or more reactive gases mixed in with a carrier gas, such as hydrogen. In one example, the second gas flow 214 includes a nonreactive gas, such as nitrogen.

Physical walls 220 of the containment housing separate the process chamber and thus the processing sections from the outside or ambient environment. An inside region 222 of the containment housing can maintain an average pressure that is less than, equal to or greater than the outside or ambient environment. For each deposition zone, the second gas flow 214 from a region laterally outside of the exhaust port 210 that surrounds the deposition zone can entrain or block contaminating particles or gases arriving from outside of the virtual wall 206, and dispose of such contaminants out the exhaust port 210. The first gas flow 216 from the showerhead tiles, or from one or more inlet ports between or outside of the showerhead tiles and laterally interior to the virtual walls 206, to the exhaust port 210 that surrounds the deposition zone can entrain contaminating particles or gases from the deposition zone and dispose of such contaminants out the exhaust port 210. Showerhead temperature is controlled in one example, with the showerhead walls being cooled to prevent reactions on the showerhead itself.

The first gas flow 216 and the second gas flow 214 define the virtual walls 206 laterally or circumferentially surrounding the deposition zone. The virtual walls 206 separate the deposition zone and the remainder of the interior 222 of the containment housing outside of the virtual walls 206, preventing contaminants from the physical walls 220 of the containment housing, or other regions within the containment housing but outside of the virtual walls 206 from entering the deposition zone. The virtual walls prevent contaminants from the deposition zone from entering the region or regions outside of the virtual walls and inside the remainder of the containment housing. Further, in a CVD reactor having multiple deposition zones, the virtual walls support separate pressure and temperature environments in each of the deposition zones.

Figure 3:
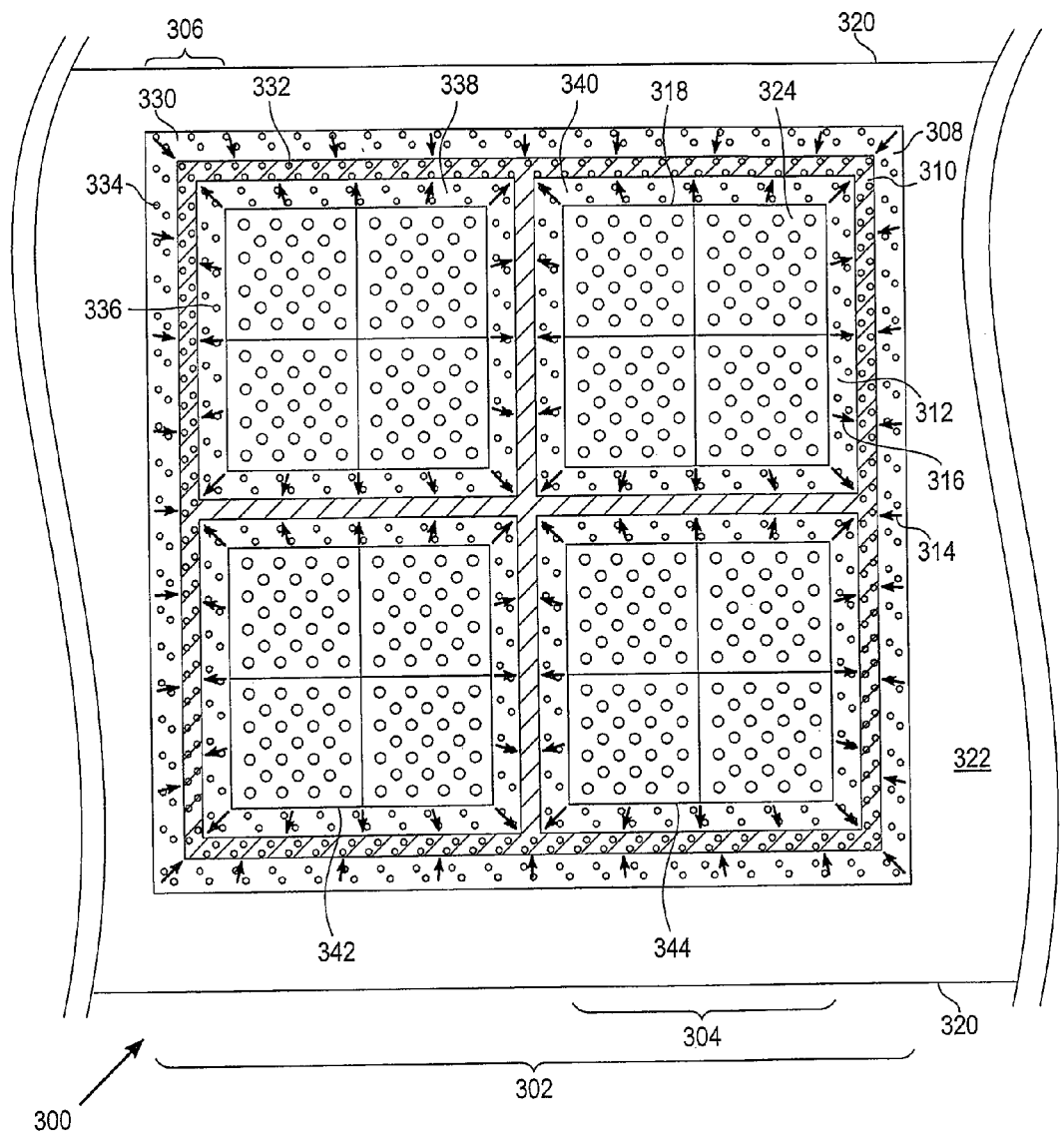
FIG. 3 is a bottom view of a further tiled showerhead defining virtual walls for a chemical vapor deposition zone, as a variation of the tiled showerhead shown in FIG. 2.

With reference to FIG. 3, a further configuration for the virtual walls is shown in a view from below of a variation of a showerhead assembly 302. The gas flow virtual walled deposition zone 300 includes a plurality of target reaction zones 304. The virtual walls 306 are defined by gas flows 314, 316. A showerhead assembly 302 is seen from below as if by viewed by a plurality of substrates in the deposition zone or in respective deposition zones. The virtual walls 306 laterally or circumferentially surround the deposition zone or zones and the target reaction zones 304 and thus define the outer perimeter of the deposition zone or zones. The virtual walls 306 further separate deposition sub zones within the deposition zone or equivalently separate respective deposition zones within the plurality of deposition zones. In each interpretation, a deposition zone is laterally surrounded and circumferentially bounded by the virtual walls 306. Similarly to the example shown in FIG. 2, the showerhead forms a ceiling of the deposition zone and the substrate or target reaction zone forms a floor of the deposition zone.

Principles, structure and operation of the showerhead assembly 302 and the gas flow virtual walled deposition zone 300 are related to and similar to the corresponding aspects of the showerhead assembly 202 and the gas flow virtual walled deposition zone 200. The showerhead assembly 302 includes four groups of showerhead tiles 324, and each group of showerhead tiles has four showerhead tiles 324. In a variation, the showerhead assembly 302 includes four tiled showerheads 318, and each tiled showerhead 318 has four showerhead tiles 324. Further variations of the showerhead assembly 302 having various numbers of groups and various numbers of showerhead tiles in each group can be devised.

The showerhead assembly 302 is shown as having apertures 334 in an outer ring region 308, for initiating the second gas flow 314. Apertures 336 in an inner ring region 312 can emit a gas or gases e.g. nitrogen or hydrogen that can combine with a gas or gases e.g. one or more reactive gases and/or a carrier gas such as hydrogen as emitted by the showerhead tile 324 to initiate and form the first gas flow 316. Each tiled showerhead 318 or group of showerhead tiles 324 can have a respective inner ring area 340, 338 as shown, or an inner ring 312 can surround all of the showerhead tiles 324. The exhaust port 310 laterally surrounds the deposition zone or plurality of deposition zones. The first gas flow 316 merges with the second gas flow 314 and the merged gas flows are pulled out through apertures 332 of the exhaust port 310 as a third gas flow, which will be further described below. Variations of the showerhead assembly 302 have channels or apertures for gas flows, and liners proximate to the showerhead assembly 302 have apertures or channels for the gas flows. In one example, the showerhead assembly 302 has an integrator plate 330, to which the tiled showerheads 318, 342 and 344 and so on are mounted. Physical walls 320 of the containment housing seal the interior 322 of the CVD reactor from the outside or ambient garment, and the virtual walls 306 isolate the deposition zone or zones from the interior 322 of the CVD reactor that is outside of the virtual walls 306. In the example shown, the virtual walls 306 further isolate deposition sub zones within a deposition zone, or in a variation, further isolate respective deposition zones from one another. Cross-contamination among deposition zones or sub zones is thus decreased, as is cross-contamination to or from each of the deposition zones or sub zones and to or from the interior 322 of the CVD reactor outside of the virtual walls 306. Cross-contamination is decreased to or from each of the deposition zones or sub zones and to or from the physical walls 320 of the containment housing.

Figure 4:
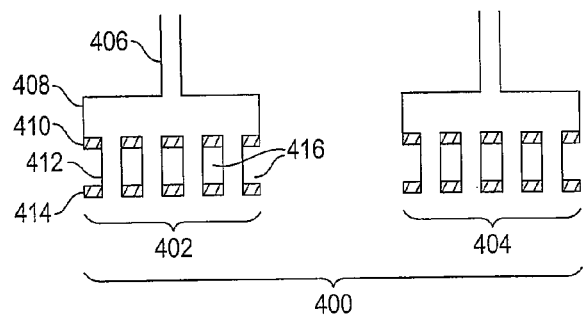
FIG. 4 is an elevated side cross-section view of a tiled showerhead as used in the CVD reactor of FIG. 1 or a variation thereof.

With reference to FIG. 4, each tile 402, 404 of the tiled showerhead 400 has provisions for a cooling fluid (not shown) that regulates the temperature of a gas or gases prior to dispersal from the tiled showerhead 400. The tiled showerhead 400 is built up from a plurality of showerhead tiles 402, 404 and includes associated plumbing and fixtures. One or more gas supply tubes 406 provides gas or gases to a plenum 408, where gases can mix and pressure of the gas or gases can equalize. The gas or gases then proceed from the plenum 408 through a baseplate 410 and through needle tubes 412 to and through the showerhead plate 414, and are dispersed from the showerhead plate 414 for CVD processing of a substrate. The cooling fluid circulates throughout the spaces 416 around the needle tubes 412, which have a high surface area to volume ratio thus aiding in even temperature control of the gas or gases within the needle tubes 412. A casing that seals the cooling fluid passages is not shown and is readily devised. For presentation purposes, exhaust ports, an integrator plate, further gas inlets and so on are not shown in FIG. 4.

Figure 5:
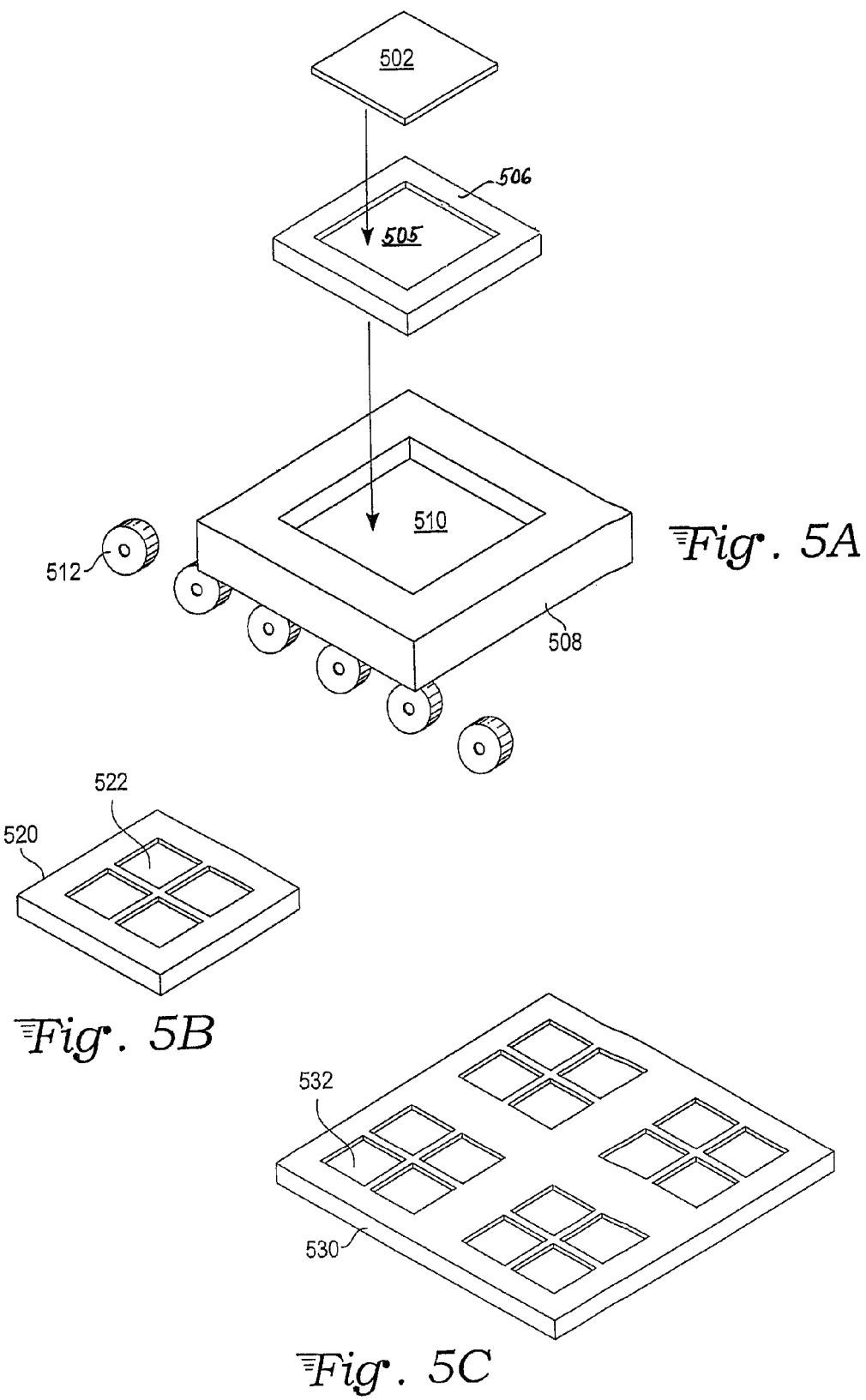
FIG. 5A is a perspective view of a substrate, a susceptor and a carrier as used in the CVD reactor of FIG. 1 or a variation thereof.
FIG. 5B is a perspective view of a variation of the susceptor of FIG. 5A, for use with the tiled showerhead of FIG. 2.
FIG. 5C is a perspective view of a further variation of the susceptor of FIG. 5A, for use with the tiled showerhead of FIG. 3.

With reference to FIG. 5A, the CVD reactor of FIG. 1 uses a substrate carrier 508 moved by rollers 512 for transporting a target substrate. In variations, further mechanisms for transporting a substrate can be applied with or without a carrier and with or without a susceptor, such as a conveyor belt, gas levitation, trains of pushed or pulled carriers, self-propelled carriers, sliding wafers or carriers, carrier boats, a carousel etc. In the example shown in FIG. 5, the carrier 508 is made of optically transmissive quartz. The carrier 508 has an indentation 510, dimensioned to receive and retain an optical radiation absorptive susceptor 506. In the example shown in FIG. 5, the susceptor 506 is made of graphite. The susceptor 506 has an indentation 505 dimensioned to receive and retain a substrate 502 that is in thermal contact with the susceptor 506. For processing, the substrate 502 is inserted into the indentation 505 in the susceptor 506, and the susceptor 506 is inserted into the indentation 510 in the quartz carrier 508. The quartz carrier 508 is then moved by rollers 512. Heating lamps (see FIG. 6) direct optical radiation through the quartz carrier 508 to heat the susceptor 506 and hence the substrate 502. Thus, the susceptor is radiatively heated by optical radiation from an infrared radiation source passing through the carrier 508, and the substrate 502 is conductively heated by the susceptor 506. The substrate 502 is directly conductively heated and indirectly radiatively heated. Further heating mechanisms can be devised.

With reference to FIG. 5B, a further susceptor 520 is shown, having indentations 522 for a plurality of substrates. The susceptor 520 is used with a tiled showerhead having a number of showerhead tiles corresponding to the number of substrates being processed under the tiled showerhead. The susceptor 520 has a two by two array of indentations 522 for processing a group of four substrates. Further variations of susceptors can be devised having various numbers of indentations or various dimensions of the indentations.

With reference to FIG. 5C, an alternate susceptor 530 is shown, having indentations 532 for a plurality of groups of substrates, each group having a plurality of substrates. The susceptor 530 is used with a tiled showerhead having groups of showerhead tiles, each group having a plurality of showerhead tiles. The total number of showerhead tiles in the tiled showerhead is equal to the total number of substrates being processed under the tiled showerhead. The susceptor 530 has a two by two array of groups of indentations, each group of indentations having a two by two array of indentations, for a total of sixteen indentations as used in processing sixteen substrates. Further variations of susceptors can be devised having various numbers of groups of indentations, various numbers of indentations in each group or various dimensions of the indentations.

Figure 6:
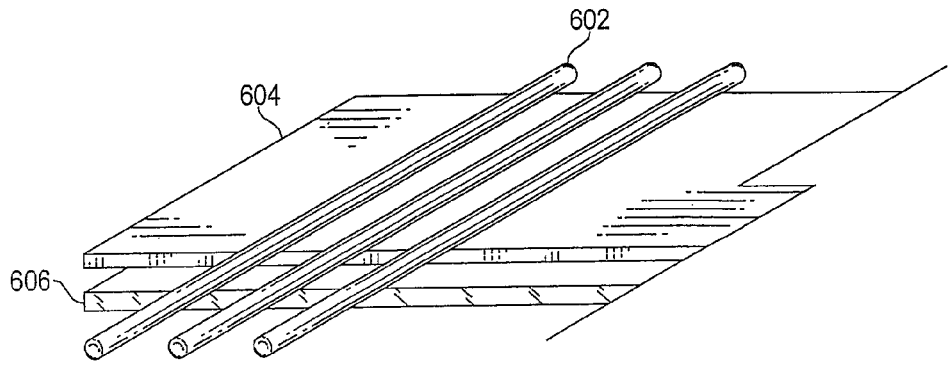
FIG. 6 is a perspective view of lamps, a lamp liner and a transport plate. The lamps provide optical radiation for heating the substrate of FIG. 5A or other substrates in the CVD reactor of FIG. 1.

With reference to FIG. 6, a lamp liner 604 beneath infrared lamps 602 protects the floor of the containment housing (not shown) from excess heat from the lamps 602 or from contaminants in the vicinity of the lamps 602. In one version, the lamp liner 604 has a roughened surface and/or is made of a material with many small bubbles such as opaque quartz. Such a material scatters light and/or acts as a reflector. A transport plate 606 beneath the lamp liner 604 is watercooled, and maintains temperature of the floor of the containment housing by removing waste heat at a lower level of the containment housing. The transport plate 606 is associated with the transport mechanism that moves the substrates. Water cooling channels and associated plumbing for water cooling of the transport plate 606 are readily devised.

The lamps 602 provide optical heating. In the example shown in FIGS. 5 and 6, optical radiation from the lamps 602 passes through the quartz carrier 508 and is absorbed by the graphite susceptor 506, 520 or 530. In turn, the susceptor 506, 520 or 530 retains heat and heats the substrate 502. In a further example, the optical radiation from the lamps 602 heats the substrate carrier 508, which then retains the heat and heats the susceptor 506, 520 or 530. The lamps 602 can be controlled individually or in groups, so that temperatures can be varied for differing processing sections in the CVD reactor 100.

Figure 7A:
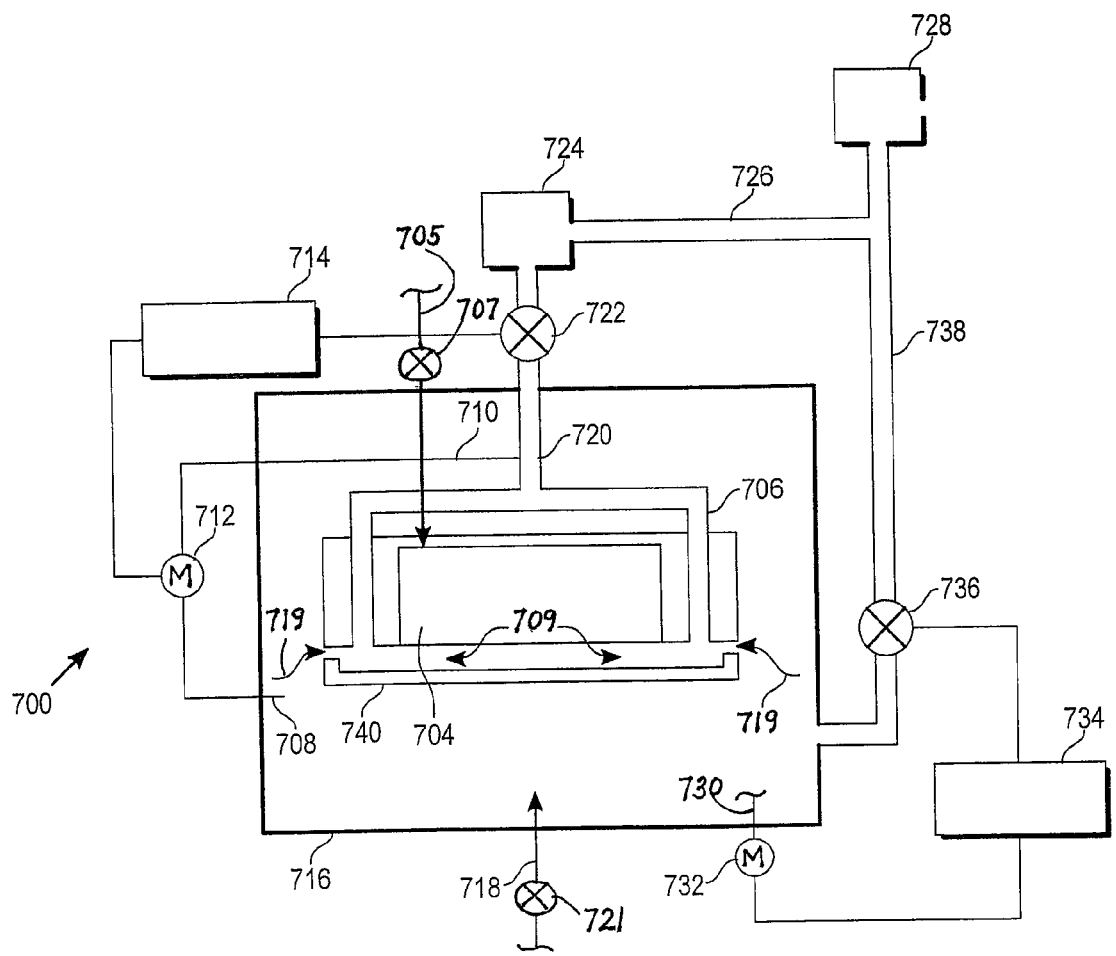
FIG. 7A is a plan view of a pressure control system for use in the CVD reactor of FIG. 1.

With reference to FIG. 7A, a pressure control system 700 controls exhaust pressure and pressure outside of the virtual walls of a deposition zone, inside a containment housing 716. The deposition zone is between the showerhead 704 and a substrate carrier 740 and is surrounded by gas flow virtual walls as discussed above. Inflowing reactant gas into showerhead 704 is represented by arrow 705 and regulated by valve 707. Gas out of the showerhead is represented by arrows 709. The first gas flow represented by arrows 709 merges with gas inflow represented by arrows 719 from inlet 718 to form virtual walls and then flow out through exhaust manifold 720. A manometer 732 senses pressure from a first pressure pickup point 730 inside of the containment housing 716 and outside of the virtual walls and the deposition zone. A pressure controller 734 reads the manometer 732 and adjusts a gas flow valve 736 in a vacuum line 738 leading to a vacuum pump 728 to regulate the pressure inside of the containment housing 716. A nitrogen inlet represented by arrow 718 and regulated by valve 721 provides a flow of non-reactant nitrogen gas to the interior of the containment housing 716.

A differential manometer 712 measures a difference in pressure between a second pressure pickup point 708 and a third pickup point 710. The second pressure pickup point 708 is inside the containment housing 716 and adjacent to the outside edge of the perimeter of the substrate carrier 740, outside of the virtual walls. The third pickup point 710 is inside the exhaust manifold 720 and is thus related to the pressure inside each of the branches 706 of the exhaust manifold 720. A pressure controller 714 reads the pressure difference from the differential manometer 712 and adjusts an exhaust gas flow valve 722 connected between the exhaust manifold 720 and a cold trap 724. The cold trap 724 removes contaminants from the exhaust, and the cleansed exhaust is passed through a vacuum line 726 to the vacuum pump 728. By regulating the various pressures, gas flow from outside of the virtual walls to the exhaust manifold 720 can be controlled.

Figure 7B:
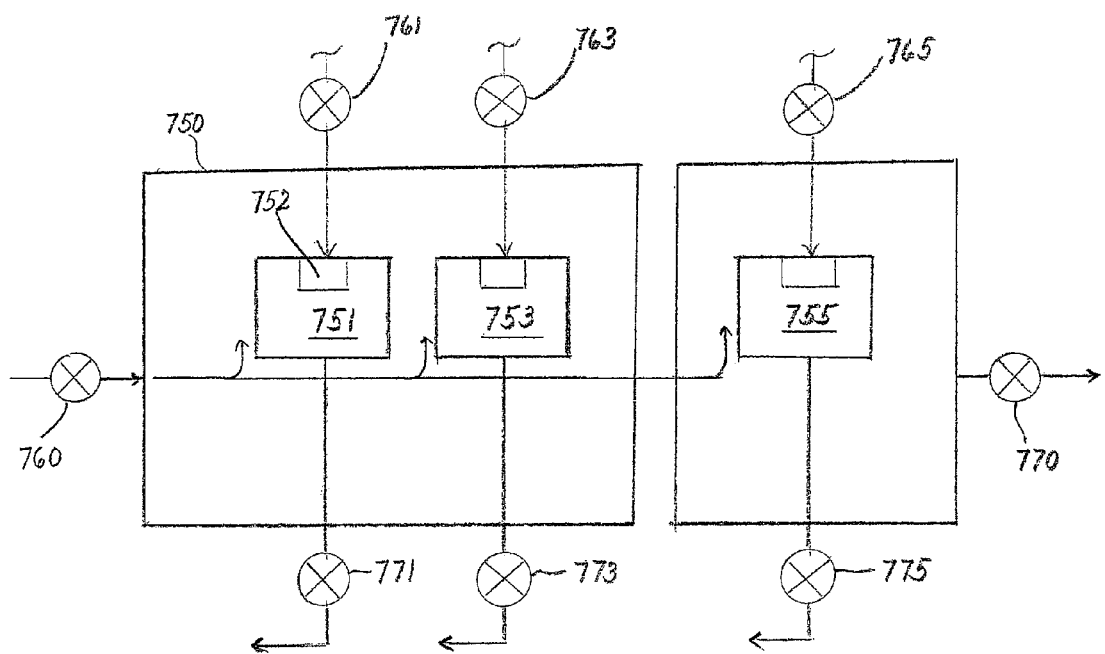
FIG. 7B is a plan view of the CVD reactor of FIG. 1 with multiple deposition zones in a single reactor housing.

With reference to FIG. 7B, a plurality of deposition zones 751, 753 and 755 are shown in reactor housing 750. Deposition zone 751 has a gas inlet valve 761 controlling reactant gas flow into a deposition showerhead 752 and an exhaust valve 771 controlling gas flow out of an exhaust manifold where reactant and non-reactant gas flows merge to form virtual walls before being removed from reactor housing 750 through exhaust valve 761. Non-reactant gas flows into reactor housing 750 through inlet valve 760.

Deposition zone 753 has showerhead gas inlet valve 763 and exhaust valve 773, while deposition zone 755 has showerhead gas inlet valve 765 and exhaust valve 775. Pressure balance is achieved in two ways. First, the reactant gas inflow can be pressure balanced against the merged gas outflow from the manifold surrounding a deposition zone. This can be done for each deposition zone. Then the non-reactant gas flow into the housing 750 via inlet valve 760 is pressure balanced against the outlet valve 770. The outlet valve 770 is adjusted to reduce any pressure differences within the reactor housing.

Where multiple deposition zones exist within one reactor housing, virtual walls are formed for each deposition zone by spent inflowing reactant gas merging with inflowing non-reactant gas. As described above, each showerhead has a surrounding gas manifold for exhausting this merged gas. To maintain pressure balance the housing has an exhaust valve that is adjusted to minimize pressure build-up beyond the desired pressure for forming virtual walls exhausted by the gas manifolds and maintaining the stability of the virtual walls.

Figure 8:
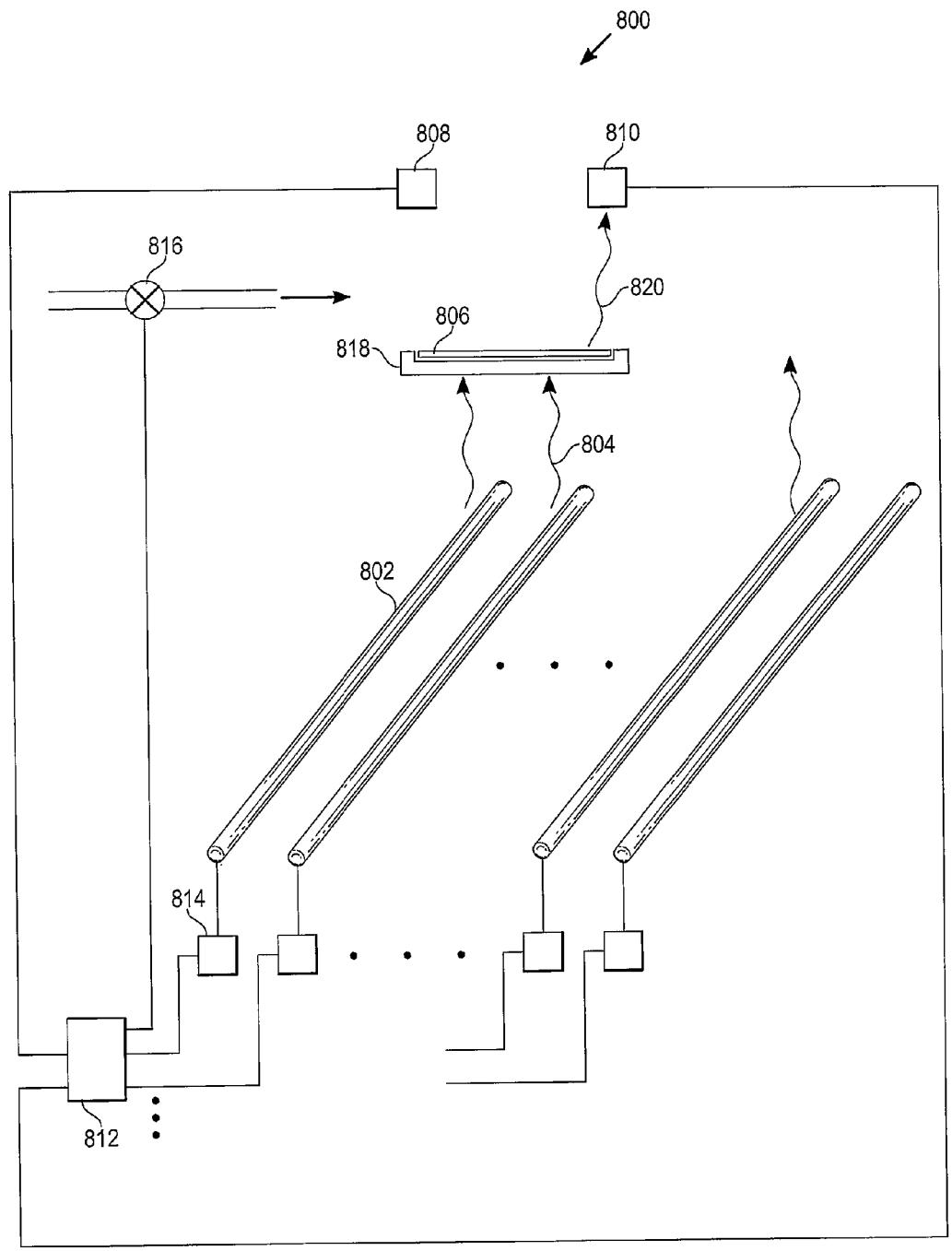
FIG. 8 is a plan view of a temperature control system for use in the CVD reactor of FIG. 1.

With reference to FIG. 8, a temperature control system 800 provides closed loop temperature control in the CVD reactor 100. The substrate 806 may be directly heated, or is indirectly heated by infrared radiation 804 from the lamps 802 that is absorbed by the susceptor 818. In the example shown, the susceptor 818 is radiatively heated by the heating lamps 802, and the substrate 806 is conductively heated by the susceptor 818. Temperature sensors, including a thermistor 808 in a showerhead and a pyrometer 810 detecting infrared radiation 820 from the heated substrate 806, detect and measure temperature at respective locations. In a variation, thermistor 808 is replaced by a thermocouple or other temperature measuring device. A programmable logic control (PLC) controller 812 analyzes the temperatures and determines control actions, including regulating water cooling flow to the showerhead by adjusting a water cooling flow valve 816 and sending a pulse width modulation AC signal to SCR drivers 814 controlling the heating lamps 802. As discussed above, individual lamps 802 or groups of lamps can be controlled in order to regulate temperatures in differing sections of the CVD reactor 100. The temperature control system 800 controls heat added to one or more sections of the CVD reactor 100 by controlling individual or groups of lamps 802, and controls heat removed from one or more sections of the CVD reactor 100 by controlling water or other fluid cooling.

The ability of the gas flow virtual walls to maintain and support differing temperatures in various regions within the CVD reactor 100 is advantageously applied in semiconductor processing. In a set of examples, the showerhead is maintained close to room temperature, or at 200° C.-400° C., or at 250° C., and the quartz carrier is heated to higher temperatures e.g. 800° C. Cooling around the showerhead decreases or prevents reactions on the showerhead, so that reactions preferentially occur on the heated substrate. A heated exhaust port decreases or prevents condensation in the exhaust port. The containment housing is at approximately room temperature.

In various examples, the ability of virtual walls to maintain and support differing pressures in various regions within the CVD reactor 100 is advantageously applied in semiconductor processing. In one example, pressure in a deposition zone is maintained at 100 torr or 0.13 atmosphere (1 atmosphere is approximately equal to 760 torr) while the remainder of the interior of the CVD reactor 100 may be at substantially higher pressure. In a further example, the gas flows and pressure balancing take into account diffusion velocity versus flow velocity of the gases. When hydrogen gas is used as a carrier gas, e.g. in MOCVD (metal organic chemical vapor deposition), the diffusion velocity of molecules of a reactant gas through the hydrogen gas is often greater than the flow velocity of either of the gases, especially when flow velocity is low. In such a case, a process gas diffuses through the hydrogen rapidly. The gas flows and pressure balancing are adjusted accordingly.

Figure 9:
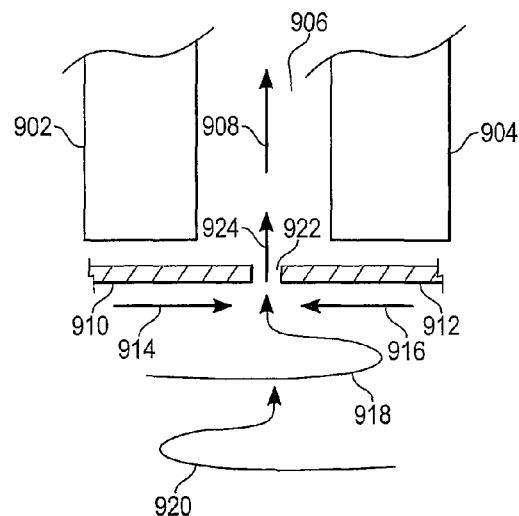
FIG. 9 is a cutaway side view of an exhaust port and a liner for use in the CVD reactor of FIG. 1, showing gas flows.

With reference to FIG. 9, orifice sizes, quantities and spacings can be adjusted to tune gas flows. An exhaust port 906 receives gases from differing directions. The first gas flow 914 and the second gas flow 916 merge to form a third gas flow 924. The exhaust port 906 is maintained at a lower pressure than the gas flows 914, 916, by a vacuum pump. A pressure difference or delta between the exhaust port 906 and the gas flows 914, 916 causes the gases to pass into the exhaust port as the third gas flow 924, 908. A liner 910, 912 at the opening of the exhaust port 906 has one or more orifices 922, through which the gases pass en route to the exhaust port 906. The number of orifices 922, the size, diameter or other dimensions of each orifice 922, and the spacing of the orifices 922 (where numbered greater than one) are adjusted for uniform flow of the gases. Thickness of a liner 910, 912, which affects a depth of an orifice 922, may also be adjusted. Such variables are adjusted to account for the pressure delta, the viscosity of the gas or gases, the molecular weight of the gas or gases, the velocity of the gas or gases and the desired flow. It is desirable to avoid overshoot 918, 920 of the gases past the orifice 922 or orifices, which can allow contaminants to pass through the gas flow virtual walls. In a properly adjusted system, orifices 922 of nozzles, liners and channels for/inlets, outlets, exhausts etc. are balanced in concert with the pressure control for the various gases so that uniform flow of the gases results, and overshoot of gases is minimized or eliminated. Such a properly adjusted system reduces cross-contamination, as the passage of contaminants through the gas flow virtual walls is decreased or eliminated.

Figure 10:
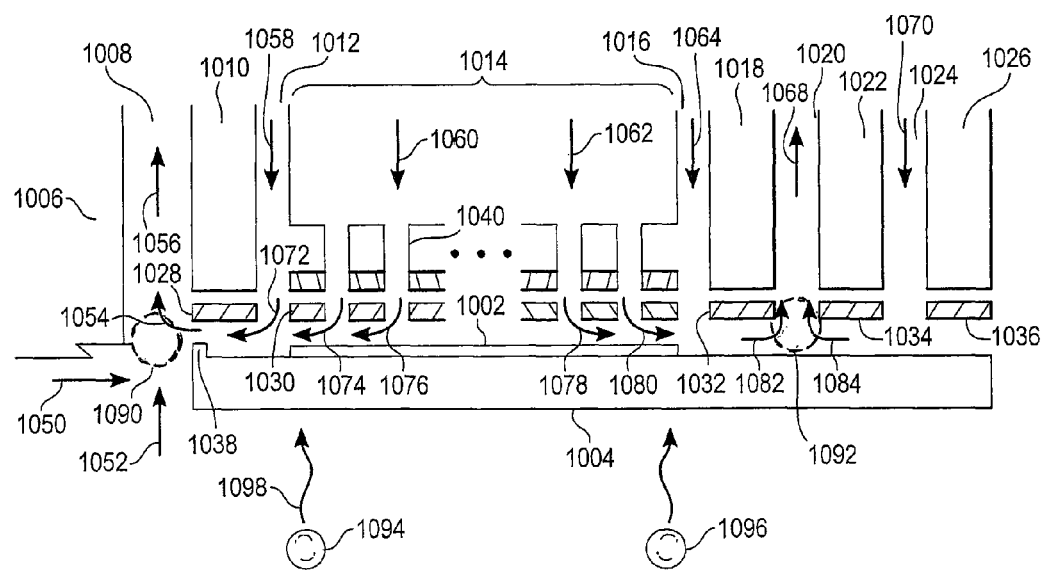
FIG. 10 is a cutaway side view of a showerhead, a substrate, a carrier, exhaust ports and gas flows as used in the CVD reactor of FIG. 1.

With reference to FIG. 10, gas flows are shown through and from a showerhead 1014, along and above a surface of a substrate 1002, into and out through an exhaust port 1008, 1020. Further gas flows are shown from an isolation gas inlet 1024 along and above a surface of a substrate carrier 1004, and out through the exhaust port 1020. As described above, the various orifices are adjusted as to size, quantity and spacing, and the gas pressures are controlled so as to achieve uniform gas flows without overshoot.

FIG. 10 shows two examples of gas flow virtual walls 1090, 1092 that are established and maintained in a related manner, albeit with differences. On the right half of FIG. 10, a reactant gas flow 1062 originates from the showerhead 1014 and flows across the surface of the substrate 1002 in a laminar radially outward flow 1078, 1080. A non-reactant gas flow 1064 from a non-reactant gas inlet 1016 joins the radially outward gas flow 1078, 1080 and continues in a lateral radially outward gas flow 1082. A non-reactant or isolation gas flow 1070 from an isolation gas inlet 1024 that is laterally external to the exhaust port 1020 becomes a lateral radially inward gas flow 1084. The radially outward gas flow 1082 is pressure balanced against the radially inward gas flow 1084 to decrease or eliminate overshoot of either of the gas flows, i.e. the respective gas flows are mutually pressure balanced. The gas flow virtual wall 1092 is formed at the juncture of the radially outward gas flow 1082 and the radially inward gas flow 1084, i.e. at the juncture of the first and second gas flows, proximate to the exhaust port 1020. Low pressure in the exhaust port 1020 pulls the radially outward gas flow 1082 as a first gas flow and pulls the radially inward gas flow 1084 as a second gas flow, so that the first gas flow merges with the second gas flow to become a third gas flow 1068 exiting out through the exhaust port 1020. The gas flow virtual wall 1092 has a radial component, in that the first and second gas flows are radially outward and radially inward, respectively. The gas flow virtual wall 1092 has a vertical component in that the third gas flow exits vertically through the exhaust port 1120. As the first and second gas flows merge into the third gas flow, the gases have both radial and vertical flow components.

On the left half of FIG. 10, a reactant gas flow 1060 originates from the showerhead 1014 and flows across the surface of the substrate 1002 in a laminar radially outward flow 1076, 1074. A non-reactant gas flow 1058 from a non-reactant gas inlet 1012 joins the radially outward gas flow 1076, 1074 and continues in a lateral radially outward gas flow 1072 as a first gas flow. Further non-reactant and/or isolation gas flows 1050, 1052 from laterally adjacent to the substrate carrier 1004 arrive as a second gas flow, merge with the first gas flow to form a third gas flow 1054, 1056 and exit through an exhaust port 1008. The gas flow virtual wall 1090 is formed at the juncture of the radially outward gas flow 1072 as a first gas flow, and the second gas flow from a region laterally external to the substrate, the carrier, and the deposition zone. The radially outward gas flow 1072 and the non-reactant and/or isolation gas flow 1050 each have a radial flow component. The non-reactant and/or isolation gas flow 1052 and the merged gases forming the third gas flow 1054, 1056 have a vertical flow component. The respective gas flows are pressure balanced so as to reduce cross-contamination.

A further variable available for adjustment and control of gas flows is the presence or absence of a lip 1038 or ridge on the carrier 1004, and a location or a height thereof. By adding and adjusting the height of a lip 1038 on the carrier 1004, the cross sectional area through which a gas flow is directed can be adjusted. Such adjustment is comparable to adjusting a diameter of an orifice as described above.

FIG. 10 depicts a third gas flow 1056, 1068 exiting upwards through an exhaust port 1008, 1020. The exhaust port 1008, 1020 is positioned laterally outside of the extent of the substrate 1002 and is positioned above a plane of the top surface of the substrate 1002, where deposition takes place. The embodiment shown supports lateral movement of a substrate into and out of the deposition zone. In further variations of the CVD reactor 100, a substrate may have various further directions of movement or other considerations affecting exhaust port placement and structure. The exhaust port could pull gases downwards, and be positioned below the plane of the top surface of the substrate 1002. The exhaust port could have tubes or other extensions into an interior region of the virtual walls and pull gases out thusly. Further variations in placement and other aspects of structure of an exhaust port can be devised.

Liners can be used. In the example shown in FIG. 10, one or more liners 1028, 1032, 1034, 1036 protect the respective exhaust ports and inlet ports, and a showerhead liner 1030 protects the showerhead 1014 from reaction products, byproducts and contaminants. Generally, liners are replaceable and/or cleanable, and may be serviced on an as needed basis. The various orifices through the liners can be adjusted for gas flow control as described above.

Heating lamps 1094, 1096 below the substrate carrier 1004 radiate optically up through the carrier 1004 to heat the carrier 1004 and the substrate 1002. Optical radiation 1098 from the lamps further heats the exhaust port 1020 fixtures, so that unused processing gases, processing byproducts and processing waste products have minimal or no condensation on the surfaces of the exhaust port 1020. Water channels 1018, 1022 through the stainless steel exhaust port 1020 fixtures cool the exhaust port sufficiently to prevent warpage, while allowing the surfaces of the exhaust port 1020 to remain relatively hot. In one example, the exhaust port 1020 fixtures are kept at about 400 degrees C. A water channel 1026 may be used in an isolation gas port 1024.

The needle tubes 1040 of the showerhead 1014 are cooled by a liquid or a gas. In one processing example, processing gas at a first pressure is controlled to a first temperature through the showerhead 1014, by cooling of the showerhead 1014. The process gas flows over the surface of the substrate 1002, and a CVD reaction at the heated substrate 1002 results in a film being deposited upon the substrate, the CVD reaction occurring at a second temperature that is higher than the first temperature and at a second pressure. Isolation gas is controlled to a third temperature and a third pressure, and flows towards the exhaust port 1020. The reaction byproducts and leftover processing gas arrive in the vicinity of the exhaust port from a first direction. The isolation gas arrives in the vicinity of the exhaust port from a second direction. The isolation gas and the reaction byproducts and leftover processing gases mix together and are pulled out through the exhaust port 1020. Pressure in the exhaust port 1020 is at a fourth pressure, and temperature in the exhaust port 1020 is at a fourth temperature. The interior of the containment housing, outside of the processing zones, is maintained at an average fifth pressure and fifth temperature.

Each gas flow is driven by pressure differences, flow velocity and diffusion velocity, as directed by the various structures and the virtual walls. As can be seen in FIG. 10, a substrate can be moved out of a processing zone past a virtual wall formed by the various controlled gas flows, and into a further zone for further processing. In so doing, no physical door need be opened nor physical walls passed through, as the virtual walls neither present a physical wall nor require a physical door.

As a general principle, controlling the flow of a gas exerts control over the pressure of the gas. Controlling the pressure of the gas exerts control over the flow of the gas. As examples, controlling flow into a contained region and/or flow out of a contained region affects and can control pressure in the region. Controlling a pressure in a region and a differing pressure in a further region can affect and control flow between the regions. Pressure balancing can be brought about through flow control or pressure control or combinations thereof. Tying flow control to a pressure measurement can achieve pressure balancing. A pressure difference can be used to control flow. A device that measures differences in pressures between regions may provide a faster response and greater accuracy than the use of separate pressure measurement devices in each of two differing regions. Pressure measuring devices may provide a faster response and greater accuracy than mass flow meters and direct control of flow of gases. Gas valves may include throttle valves, pressure valves, flow valves and so on. Thus, in variations of the CVD reactor 100, a pressure controller is used, a flow controller is used, or a pressure controller is combined with a flow controller, to control the gas flows resulting in the virtual walls. Further, the various apertures can be tuned to control the gas flows resulting in the virtual walls. Mutual pressure balancing and other controlling of the gas flows can be accomplished by one or more of flow control, pressure control, gas valve control of one or more gas valves, adjustment, tuning, design, simulation, types of gases, trade-offs between two or more of the above-discussed factors affecting gas flows and so on.

Computational flow dynamics and other computer aided design tools can be used to simulate pressures, gas flows, geometries and dimensions of the various physical components involved in establishing and maintaining the gas flow virtual walls. Dimensions, placement, spacing and quantities of orifices, thicknesses of liners, absolute pressures, relative pressures, spacings between substrates and showerheads and/or other gas emitting fixtures, pressure balancing, gas flows, and various further factors affecting overshoot and the gas flow virtual walls can be simulated, adjusted and tuned for desired operation. Pressure balancing the first gas flow against the second gas flow so as to minimize overshoot of the exhaust port by either of the gas flows maintains the gas flow virtual walls so that the virtual walls provide mutual isolation of the chemical vapor deposition zone and the interior of the containment housing exterior to the virtual walls, with regard to contaminants.

What is claimed is:

1. A chemical vapor deposition reactor for film formation comprising:
 a containment housing; and
 a chemical vapor deposition zone inside of the containment housing;
 wherein the chemical vapor deposition zone has a perimeter exhaust port with a liner at an opening thereof and is circumferentially bounded by virtual walls defined by a first radially outward gas flow of a reactant gas and a second radially inward gas flow of a non-reactant gas that merge proximate to the perimeter exhaust port to form merged gas flow exiting out through orifices in the liner of the perimeter exhaust port, the pull of the first gas flow and the second gas flow out through the exhaust port being controlled by the presence of the orifices, to avoid overshoot of the exhaust port by either gas flow and thereby to eliminate any pressure difference within the containment housing so as to maintain stability of the virtual walls.

2. The chemical vapor deposition reactor of claim 1 further comprising:
 a plurality of chemical vapor deposition zones within the containment housing, each deposition zone having a reactant gas inlet showerhead circumferentially bounded by virtual walls defined by reactant gas through the showerhead flowing radially outwardly and merging with radially inward flowing non-reactant gas to form merged outflowing gas from a perimeter exhaust port surrounding each showerhead, the virtual walls supported by gas flowing into the containment housing through a housing inlet valve and balanced by gas flowing out of the containment housing through a housing exhaust valve, in a manner maintaining the stability of the virtual walls by eliminating any pressure difference within the housing.

3. The chemical vapor deposition reactor of claim 1 wherein the first gas flow is pressure balanced against the second gas flow such that the virtual walls provide mutual isolation of the chemical vapor deposition zone and an interior of the containment housing exterior to the virtual walls, with regard to contaminants.

4. The chemical vapor deposition reactor of claim 1 further comprising a tiled showerhead within the containment housing, having a plurality of showerhead tiles and defining the chemical vapor deposition zone such that each of a plurality of substrates in the chemical vapor deposition zone receives a respective portion of the reactant gas from a respective one of the showerhead tiles.

5. The chemical vapor deposition reactor of claim 1 further comprising a tiled showerhead within the containment housing, having a plurality of groups of showerhead tiles and defining the chemical vapor deposition zone or a plurality of chemical vapor deposition zones such that each of a plurality of substrates receives a respective portion of the reactant gas from a respective one of the showerhead tiles and each of a plurality of groups of substrates in the chemical vapor deposition zone receives the respective portions of the reactant gas from a respective one of the groups of showerhead tiles.

6. The chemical vapor deposition reactor of claim 1 further comprising a plurality of chemical vapor deposition zones inside of the containment housing, each chemical vapor deposition zone being circumferentially bounded by respective virtual walls formed by a merging beneath an exhaust port laterally surrounding that chemical vapor deposition zone of a flow of reactant gas outward from that chemical vapor deposition zone and a flow of non-reactant gas flowing inward toward the exhaust port, the orifices having a number, size and spacing chosen to account for pressure delta between the exhaust port and respective inward and outward gas flows, as well as viscosity, molecular weight and velocity of the respective gas flows so as to avoid overshoot and thereby maintain stability of the virtual walls.

7. The chemical vapor deposition reactor of claim 1 further comprising:
 a showerhead within the containment housing, supporting the chemical vapor deposition zone and having needle tubes and a first coolant for cooling a reactant gas to a first temperature;
 a heat source for heating to a second temperature at least one from a group consisting of a substrate, a susceptor and a carrier; and
 a second coolant within a coolant channel of the perimeter exhaust port for maintaining the perimeter exhaust port at a third temperature, the perimeter exhaust port being heated by the heat source.

8. The chemical vapor deposition reactor of claim 1 further comprising:
 a temperature controller; and
 a plurality of lamps controlled individually or in groups by the temperature controller and providing optical radiation for heating a susceptor holding a substrate and heating the perimeter exhaust port.

* * * * *